United States Patent
Yamamoto et al.

(10) Patent No.: US 6,987,224 B2
(45) Date of Patent: Jan. 17, 2006

(54) POLYTETRAFLUOROETHYLENE MIXED POWDER USED FOR INSULATION OF PRODUCT FOR HIGH FREQUENCY SIGNAL TRANSMISSION AND PRODUCT FOR HIGH FREQUENCY SIGNAL TRANSMISSION USING THE SAME

(75) Inventors: Katsutoshi Yamamoto, Settsu (JP); Hiroyuki Yoshimoto, Settsu (JP); Kazuo Ishiwari, Settsu (JP); Shinichi Yano, Settsu (JP)

(73) Assignee: Daikin Industries, Ltd., Osaka (JP)

( * ) Notice: Subject to any disclaimer, the term of this patent is extended or adjusted under 35 U.S.C. 154(b) by 114 days.

(21) Appl. No.: 10/311,063

(22) PCT Filed: May 29, 2001

(86) PCT No.: PCT/JP01/04497

§ 371 (c)(1),
(2), (4) Date: Dec. 13, 2002

(87) PCT Pub. No.: WO01/97234

PCT Pub. Date: Dec. 20, 2001

(65) Prior Publication Data

US 2004/0112627 A1    Jun. 17, 2004

(30) Foreign Application Priority Data

Jun. 15, 2000 (JP) .............................. 2000-179552

(51) Int. Cl.
*H01B 7/34* (2006.01)
(52) U.S. Cl. .................................... 174/36; 174/110 R
(58) Field of Classification Search ............... 174/36, 174/110 R, 102 R, 106 R, 120 R, 120 SC
See application file for complete search history.

(56) References Cited

U.S. PATENT DOCUMENTS

| | | | | |
|---|---|---|---|---|
| 4,945,126 | A | * | 7/1990 | Crosby et al. ............... 524/507 |
| 5,102,921 | A | * | 4/1992 | Harada et al. ............... 521/134 |
| 5,110,527 | A | * | 5/1992 | Harada et al. ............... 264/127 |
| 5,216,079 | A | * | 6/1993 | Crosby et al. ............... 525/146 |

(Continued)

FOREIGN PATENT DOCUMENTS

EP    616004    9/1994

(Continued)

OTHER PUBLICATIONS

Translation of International Preliminary Examination Report for PCT/JP01/04497 dated Feb. 20, 2002.

*Primary Examiner*—William H. Mayo, III
(74) *Attorney, Agent, or Firm*—Sughrue Mion, PLLC

(57) ABSTRACT

A polytetrafluoroethylene mixed powder, which is obtained by mixing low molecular weight polytetrafluoroetylene powder and high molecular weight polytetrafluoroethylene powder obtained by emulsion polymerization of tetrafluoroethylene, wherein the low molecular weight polytetrafluoroetylene powder has a number average molecular weight of 1,000,000±500,000 and a maximum peak temperature of 327±5° C. in the endothermic curve appearing on the crystalline melting curve obtained by using a differential scanning calorimeter, the high molecular weight polytetrafluoroethylene powder has a number average molecular weight of 4,500,000±1,000,000 and a maximum peak temperature of 340±7° C. in the endothermic curve appearing on the crystalline melting curve obtained by using a differential scanning calorimeter, and the mixed powder has evident peak temperatures of 327±5° C. and 340±7° C. in the endothermic curve appearing on the crystalline melting curve obtained by using a differential scanning calorimeter.

14 Claims, 1 Drawing Sheet

U.S. PATENT DOCUMENTS

| | | | |
|---|---|---|---|
| 5,684,088 A | * | 11/1997 | Miyamori et al. ............. 525/64 |
| 5,697,390 A | * | 12/1997 | Garrison et al. ............ 132/321 |
| 5,834,528 A | * | 11/1998 | Tanaka et al. ............... 521/145 |
| 6,207,091 B1 | * | 3/2001 | Kanamoto et al. ...... 264/173.11 |
| 6,303,686 B1 | * | 10/2001 | Kitahara et al. ............ 524/546 |

FOREIGN PATENT DOCUMENTS

| | | |
|---|---|---|
| EP | 936848 | 8/1999 |
| JP | 11-213777 | 8/1999 |
| JP | 2000-133899 | 5/2000 |

* cited by examiner

POLYTETRAFLUOROETHYLENE MIXED POWDER USED FOR INSULATION OF PRODUCT FOR HIGH FREQUENCY SIGNAL TRANSMISSION AND PRODUCT FOR HIGH FREQUENCY SIGNAL TRANSMISSION USING THE SAME

TECHNICAL FIELD

The present invention relates to a product for high frequency signal transmission, whose dielectric loss at high frequency is small and which has excellent end processability, and a polytetrafluoroetylene (PTFE) mixed powder which is suitable for forming the insulation layer of the product.

BACKGROUND ART

Cables for transmission of high frequency signals, such as a coaxial cable and a LAN cable always cause dielectric loss. Printed wiring boards used for various transmission devices for transmission of high frequency signals have the same kind of serious dielectric loss problems.

The dielectric loss is a function of dielectric constant ($\in$) and dielectric dissipation factor (tan δ). The smaller the two factors, the better. In order to reduce the dielectric loss, several attempts have been made to prepare a high frequency cable in which PTFE having excellent electric properties is used as a material for the insulating coating layer (JP-A-11-31422, JP-A-11-283448 and JP-A-2000-21250).

Meanwhile, the melting point, dielectric constant, dielectric dissipation factor, and in addition, mechanical strength of PTFE undergo some changes due to heat treating (sintering). For example, non-sintered PTFE has a melting point of as high as $340\pm7°$ C., a dielectric constant ($\in$) of as low as 1.8 and a dielectric dissipation factor (tan δ) of as low as $0.5\times10^{-4}$ (all measured at 12 GHz, also in the followings), while half-sintered (semi-sintered) PTFE has a melting point of as low as $327\pm5°$ C., a dielectric constant ($\in$) of as high as 2.0 and a dielectric dissipation factor (tan δ) of as high as $0.7\times10^{-4}$. In the case of completely sintered PTFE, the melting point is further lowered to $323\pm5°$ C., the dielectric constant ($\in$) becomes as high as 2.1 and the dielectric dissipation factor (tan δ) becomes as high as $2.0\times10^{-4}$, while the mechanical strength is improved by sintering.

Accordingly, it is effective to use the non-sintered or semi-sintered PTFE in view of the dielectric loss. On the other hand, it is effective to use the sintered PTFE in view of the end processability and strength.

In such circumstances, the above publications attempted to prepare an insulating coating layer in which sintered PTFE, semi-sintered PTFE and non-sintered PTFE are combined together in order to improve processability while maintaining electric properties such as dielectric constant and dielectric dissipation factor.

In JP-A-11-31442, a method of increasing the sintering degree of the outer surface of the insulating coating layer comprising non-sintered PTFE (differentiation of PTFE sintering degree in the radial direction) is proposed.

In JP-A-11-283448, a method in which the insulating coating layer basically comprises non-sintered or semi-sintered PTFE, and the end portions to be processed (10 cm from the end) is made of completely sintered PTFE (differentiation of sintering degree in the longitudinal direction of the core) is proposed.

Furthermore, in JP-A-2000-21250, a PTFE porous layer is used for the insulating coating layer and the surface of the PTFE porous layer is sintered to adjust the crystallinity to be as high as 75 to 92% (differentiation of sintering degree in the radial direction).

However, with respect to the processability of the end portion of the cable, the end portion of cables using non-sintered or semi-sintered PTFE cannot be cut neatly but becomes fibrous and stringy when the end is peeled or cut by a nipper and the like.

For these reasons, smooth end processing has been considered impossible unless completely sintered PTFE is used as in JP-A-11-283448.

Though sintering degree and crystallinity of PTFE for insulating coating layer of high frequency cable has been variously studied in this way, the molecular weight of PTFE has not been considered. Thus, the present invention focuses on the previously unnoticed molecular weight of PTFE, from the viewpoint that low molecular weight PTFE is less likely to become like fibers at end portions when cut, considering the sintering degree as well, and the present inventors have produced an insulating coating layer material comprising PTFE which has improved processability and end processability in addition to excellent electric properties.

An object of the present invention is to provide a high frequency cable with small dielectric loss, which has an insulating coating layer made of PTFE, and whose end portions can be processed smoothly, and PTFE powder for such PTFE insulating coating layer.

DISCLOSURE OF INVENTION

That is, the present invention relates to a PTFE mixed powder for insulation of a product for high-frequency signal transmission, which is obtained by mixing low molecular weight PTFE powder and high molecular weight PTFE powder obtained by emulsion polymerization of tetrafluoroethylene (TFE).

It is preferable that both powders may be mixed by co-coagulation.

In the mixed powder, the low molecular weight PTFE powder has a number average molecular weight of $1,000,000\pm500,000$ and a maximum peak temperature of $327\pm5°$ C. in the endothermic curve appearing on the crystalline melting curve obtained by using a differential scanning calorimeter (hereinafter referred to as "maximum endothermic peak temperature"). The high molecular weight PTFE powder, on the other hand, has a number average molecular weight of $4,500,000\pm1,000,000$ and a maximum endothermic peak temperature of $340\pm7°$ C. Furthermore, the co-coagulated mixed powder has evident peak temperatures of $327\pm5°$ C. and $340\pm7°$ C. in the endothermic curve appearing on the crystalline melting curve obtained by using a differential scanning calorimeter.

It is preferable that the ratio of the height from a base line to the peak $P_{327}$ to the height from the base line to the peak $P_{340}$ is 1/9 to 9/1, $P_{327}$ representing the peak of the endothermic curve appearing at $327\pm5°$ C. and $P_{340}$ representing the peak of the endothermic curve appearing at $340\pm5°$ C. on the crystalline melting curve obtained by using a differential scanning calorimeter.

The present invention also relates to a product for high frequency signal transmission such as a high frequency cable, obtained by molding the PTFE mixed powder.

The high frequency cable is prepared by sintering the insulating coating layer obtained by paste-extruding the PTFE mixed powder, at not more than the higher maximum peak temperature of the high molecular weight PTFE.

BEST MODE FOR CARRYING OUT THE INVENTION

Figure 1:
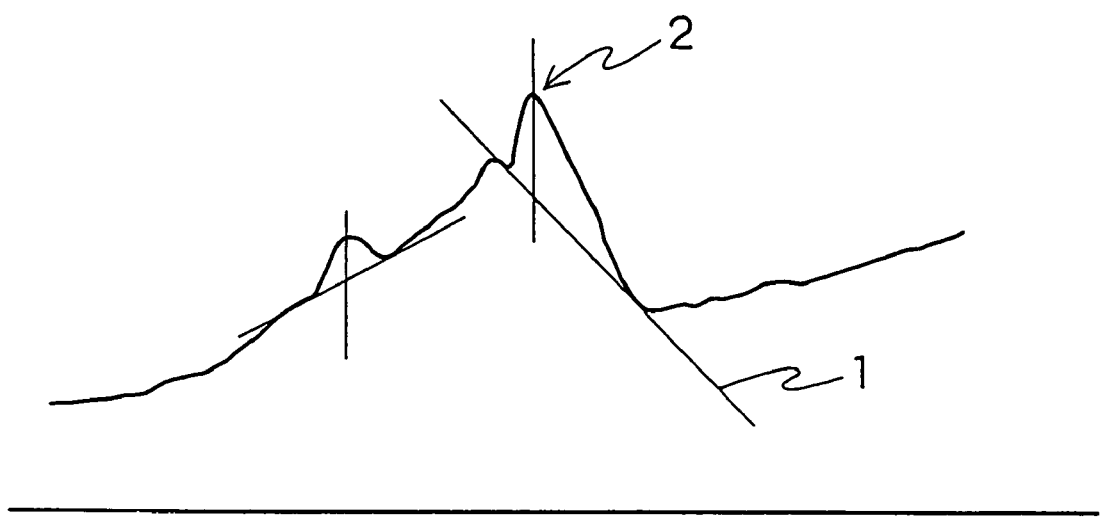
FIG. 1 illustrates a hypothetical crystalline melting curve which is to show how to determine the height from the base line to the endothermic peak.

The PTFE mixed powder of the present invention comprises a low molecular weight PTFE powder and high molecular weight PTFE powder. These PTFE powders may be a homopolymer of TFE or PTFE modified with another monomer.

The number average molecular weight of the low molecular weight PTFE powder is 1,000,000±500,000. When the number average molecular weight is large, fibrization is more likely to occur. When the number average molecular weight is too small, the ratio of remaining non-coagulated particles is increased during co-coagulation, which is industrially unfavorable.

The low molecular weight PTFE powder is prepared by emulsion polymerization. The first average particle size of the low molecular weight PTFE powder is usually about 0.02 to about 0.5 $\mu$m, preferably 0.1 to 0.3 $\mu$m (calculated from a value measured by a turbidimeter according to gravity precipitation method; the same applies in the followings).

The low molecular weight PTFE powder has a maximum endothermic peak temperature (melting point of crystal) of 327±5° C., a dielectric constant ($\in$) of 2.0 to 2.2 and a dielectric dissipation factor (tan $\delta$) of $2.0 \times 10^{-4}$ to $2.7 \times 10^{-4}$.

On the other hand, the high molecular weight PTFE powder has a number average molecular weight of 4,500,000±1,000,000, preferably 3,500,000 to 5,000,000. When the number average molecular weight is large, moldability becomes inferior. When the number average molecular weight is too small, the mechanical strength and electric properties are lowered.

The high molecular weight PTFE powder is prepared by emulsion polymerization. The first average particle size of the high molecular weight PTFE powder is usually about 0.1 to about 0.5 $\mu$m, preferably 0.2 to 0.3 $\mu$m.

The high molecular weight PTFE powder has a maximum endothermic peak temperature (melting point of crystal) of 340±7° C., a dielectric constant ($\in$) of 2.0 to 2.2 and a dielectric dissipation factor (tan $\delta$) of $1.9 \times 10^{-4}$ to $2.4 \times 10^{-4}$.

Preferably, both PTFE powders have almost the same average particle size from the viewpoint that uniform mixing can be achieved, and in particular, uniform co-coagulation can be conducted, and a uniformly dispersed mixed powder can be obtained. Conditions of the emulsion polymerization may be the same as that of the conventional method.

Then, the low molecular weight PTFE and the high molecular weight PTFE are mixed to prepare a mixed powder. In the present invention, the mixing method may be a method of dry mixing (dry blending method) or a method of mixing an aqueous dispersion of low molecular weight PTFE and an aqueous dispersion of high molecular weight PTFE and co-coagulating the mixture. The co-coagulation method is particularly preferable when minute PTFE particles (so-called fine powder) obtained by emulsion polymerization are used. Conditions of the co-coagulation method may be the same as that of the conventional method, and a preferable method is to mix two aqueous dispersions and then apply a mechanical stirring force to the mixture. In that case, inorganic acids such as hydrochloric acid and nitric acid, or a metallic salt thereof may be used together as a coagulant. In addition, an organic liquid or a filler may be used if necessary. However, the mixing method is not limited to these methods. After the co-coagulation, dehydration and drying are carried out to obtain the mixed powder of the present invention. The average particle size of the mixed powder is preferably about 200 to 1,000 $\mu$m from the viewpoint of the ease of molding.

It is preferable that the mixing ratio of the low molecular weight PTFE and the high molecular weight PTFE is one such that the ratio of the height from the base line to each endothermic peak, i.e., $P_{327}/P_{340}$ is 1/9 to 9/1. When the amount of the low molecular weight PTFE is increased, processability in extrusion molding becomes worse. When the amount of the low molecular weight PTFE is decreased, it tends to be difficult to recognize the mixing state. $P_{327}/P_{340}$ is preferably 2/8 to 8/2, more preferably 2.5/7.5 to 7.5/2.5.

The height from a base line to a peak refers to the height from the base line 1 to the summit 2 of each peak, where the base line 1 is drawn along the base of an endothermic curve as shown in FIG. 1.

The weight ratio of the low molecular weight PTFE to high molecular weight PTFE is 1/9 to 8/2, preferably 2/8 to 7/3, more preferably 3/7 to 6/4. When the amount of the low molecular weight PTFE is too small, the effect of improving the end processability is low. When the amount of the low molecular weight PTFE is too large, electric properties such as dielectric loss are deteriorated.

The thus-obtained PTFE mixed powder of the present invention has a dielectric constant ($\in$) of usually about 1.7 to 2.3, and a dielectric dissipation factor (tan $\delta$) of usually about $0.5 \times 10^{-4}$ to $2.5 \times 10^{-4}$.

The PTFE mixed powder of the present invention is molded into various parts or an insulating layer of high frequency signal transmission products according to known molding methods.

Typical examples of such parts include print wiring boards, casings and antenna connectors of cell phones, computers, telecommunication equipment and other electronic circuits, but not limited thereto. Molded articles like printed wiring boards can be prepared by molding the PTFE mixed powder of the present invention according to known molding methods such as compression molding and extrusion rolling molding.

Examples of insulating layer of high frequency signal transmission products include insulating coating layers of coaxial cables, LAN cables and flat cables, but not limited thereto.

The coaxial cable for high frequency signal transmission generally has a structure in which an insulating coating layer is provided around a metallic core, on which a metallic coating layer is further disposed as an outer layer. The PTFE mixed powder of the present invention is useful as a material for these insulating coating layers. In the followings, a method of forming an insulating coating layer of a coaxial cable by paste-extrusion is explained, but the formation of the insulating coating layer is not limited to this method.

The PTFE mixed powder of the present invention is mixed with an extrusion auxiliary and the mixture is subjected to compression pre-molding to form a cylindrical pre-molding. Subsequently, the pre-molding is filled into a paste extruder and extruded on a core wire. The extrudate is heated (at 150° to 250° C.), dried and sintered at not less than the melting point of the low molecular weight PTFE, more preferably not more than the higher maximum peak temperature of the high molecular weight PTFE. Thereafter, an outer layer is formed according to a known method.

The PTFE mixed powder of the present invention exhibits excellent properties in these steps of paste-extrusion and sintering.

That is, in conventional methods, non-sintered PTFE powder has been paste-extruded to form an insulating coating layer, but such non-sintered PTFE powder fiberizes very easily, requiring high extrusion pressure, which sometimes results in a wavy coating layer surface; but since the PTFE mixed powder of the present invention contains a fiberization-free low molecular weight PTFE powder, fiberization at extrusion molding can be prevented, making it possible to lower the extrusion pressure, while the surface of the coating layer to be obtained can be made smooth.

It is necessary to stop the sintering as early as possible at non-sintered or semi-sintered stage to maintain excellent electrical properties of the high molecular weight PTFE. In the conventional cases of high molecular weight PTFE alone, temperature of sintering must have been controlled very carefully because electric properties such as dielectric constant and dielectric dissipation factor are greatly influenced from the sintering temperature. However, in the case of the PTFE mixed powder of the present invention, since the presence of the low molecular weight PTFE moderates the influence of the sintering temperature on the electrical properties, molded articles having relatively similar electric properties can be obtained even though the sintering temperature fluctuates to some extent, and thus the sintering temperature can be easily controlled and in addition, the yield is increased.

In the present invention, the total crystallinity is 10 to 90%, preferably 20 to 80%.

In this way, since the heating condition in sintering is an important factor which influences the property of the product, a method by which the temperature can be controlled as accurately as possible is preferred. In the present invention, so-called salt bath method in which paste-extruded cables are heated and sintered by passing them through melted salt is suitably used, but there is no particular limitation. Preferable examples of melted salt include a mixture of potassium nitrate and sodium nitrate in a ratio of 1/1.

The thus-obtained insulating coating layer has a dielectric constant ($\in$) of is 1.5 to 2.3, preferably 1.8 to 2.2 and a dielectric dissipation factor (tan $\delta$) of $0.7 \times 10^{-4}$ to $2.0 \times 10^{-4}$, preferably $0.8 \times 10^{-4}$ to $1.2 \times 10^{-4}$.

In the products for high frequency signal transmission of the present invention, such as printed wiring boards and cables for high frequency signal transmission, which is prepared by using the PTFE mixed powder of the present invention, fiberization of the board and the insulating coating layer is not easily caused even in end processing or peeling owing to the low molecular weight PTFE, and workability in production facilities is thus improved.

Hereinafter, the present invention is explained in detail by means of examples, but is not limited thereto.

EXAMPLE 1

(Preparing PTFE Mixed Powder)

An aqueous dispersion of low molecular weight PTFE particles (number average molecular weight: 600,000, maximum endothermic peak temperature: 329° C., average particle size: 0.2 µm, Polyfron L-5 available from DAIKIN INDUSTRIES, LTD.) (concentration: 20%) obtained by emulsion polymerization was mixed with an aqueous dispersion of high molecular weight PTFE particles (number average molecular weight: 4,600,000, the maximum endothermic peak temperature: 345° C., average particle size: 0.25 µm, Polyfron F104 available from DAIKIN INDUSTRIES, LTD.) (concentration: 25%) obtained by emulsion polymerization, in a weight ratio of solid content of 1/1. The mixture was co-coagulated with stirring and dried to obtain a PTFE mixed powder.

A crystalline melting curve of the PTFE mixed powder was obtained by using a differential scanning calorimeter (RDC220 made by Seiko Denshi Kogyo Kabushiki Kaisha) at a heating rate of 10° C./minute to observe endothermic peaks. Endothermic peaks having a peak temperature of 329° C. and 345° C., respectively, were found (there were other peaks). When the height from each base line to each endothermic peak was measured, $P_{329}/P_{340}$ was 4/6. The measurement by using the differential scanning calorimeter was also applied to the measurement of the maximum peak temperatures of the raw material PTFE.

(Forming Insulating Coating Layer of High Frequency Cable)

To 100 parts by weight of the thus-obtained PTFE mixed powder was added 24 parts by weight of a paste extrusion auxiliary (petroleum solvent Isoper E available from Exxon Corporation) and the mixture was aged for 24 hours. Thereafter, the mixture was filled into a special preliminary press-molding machine (equipped with a cylindrical die having an inner diameter of 38 mm and a mandrel outer diameter of 16 mm), and a surface pressure of 1.96 MPa was applied to prepare a cylindrical pre-molding (length: 500 mm, outer diameter: 38 mm, inner diameter: 16 mm).

The cylindrical pre-molding was filled into a paste extruder (made by Jennings Co. Ltd., cylinder diameter: 8 mm, mandrel diameter: 16 mm, die orifice diameter: 1.32 mm), paste-extruded and coated on a core wire (American wire gage size 24, a stranded wire comprising 19 silver-plated copper wires having a diameter of 0.127 mm, apparent outer diameter: 0.65 mm) at a take-up rate of 15 m/minute. The extrusion auxiliary was removed by drying in an oven adjusted to 150° C. (passed for 10 seconds) and 250° C. (passed for 10 seconds), and heating (sintering) was carried out by passing the extrudate in a salt bath (potassium nitrate/sodium nitrate=1/1) adjusted to 340° C. for 20 seconds. A cable having a PTFE insulating coating layer whose outer diameter was 1.15 mm was prepared.

The surface of the obtained coated cable was not wavy but smooth. The ram pressure at paste extrusion was as low as 60 MPa.

The core wire of the coated cable was pulled out and crystalline endothermic curves were obtained every two meters by using the differential scanning calorimeter under the above condition. The positions of endothermic peaks were the same as that of the mixed powder. In addition, crystallization conversion values calculated from the change of the melting heat of crystal between the raw material mixed powder and the coating layer samples were in the range of 0.50 to 0.53.

Furthermore, when the coating was peeled off by using a wire stripper to examine the end processability, fiberization was not observed and the insulating layer was easily cut with a good cross section.

When dielectric constant ($\in$) and dielectric dissipation factor (tan $\delta$) after heating (sintering) were measured according to the measuring method mentioned below, the dielectric constant ($\in$) was 2.28 and the dielectric dissipation factor (tan $\delta$) was $1.76 \times 10^{-4}$ at 12 GHz.

(Measuring Dielectric Constant and Dielectric Dissipation Factor)

One hundred parts by weight of the PTFE powder and 24 parts by weight of the extrusion auxiliary (Isoper E) were mixed and the mixture was paste-extruded by using an extruder (cylinder diameter: 130 mm, mold dice inner diameter: 12 mm) to obtain a round bar. The bar was rolled by using a calender roll adjusted to 70° C. (28 m/minute) to form a film. The rolled film was dried in a hot-air dryer adjusted to 200° C. to prepare a non-sintered PTFE film having a thickness of 150 µm. The non-sintered film was immersed in the above-mentioned salt bath for 20 seconds to carry out heating, and the heated PTFE film was cut in a length of 50 mm. By using a network analyzer (HP8510 made by Hewlett-Packard Co.), resonant frequency and Q value were measured according to cavity resonance method, and dielectric constant (∈) and dielectric dissipation factor (tan δ) at 12 GHz were calculated.

COMPARATIVE EXAMPLE 1

Paste extrusion was carried out to prepare a PTFE coating cable in the same manner as in Example 1 except that the high molecular weight PTFE was solely used. The ram pressure of the paste-extrusion was 73 MPa.

Furthermore, when investigation of endothermic peaks was carried out in the same manner as in Example 1, peaks were found at the same positions as in the raw material PTFE powder. The crystallization conversion was 0.20 to 0.23. The insulating coating after heating had a dielectric constant (∈) of 2.15 and a dielectric dissipation factor (tan δ) of $0.94 \times 10^{-4}$ at 12 GHz.

In addition, when the coating was peeled by using a wire stripper to examine the end processability, fiberization was found at the cross section.

EXAMPLE 2

An aqueous dispersion of low molecular weight PTFE particles (Polyfron L-5 available from DAIKIN INDUSTRIES, LTD.) (concentration: 20%) obtained by emulsion polymerization was mixed with an aqueous dispersion of high molecular weight PTFE particles (number average molecular weight: 4,800,000, the maximum endothermic peak temperature: 347° C., average particle size: 0.28 µm) (concentration: 25%) obtained by emulsion polymerization in a weight ratio of solid content of 1/1. The mixture was co-coagulated with stirring and dried to obtain a PTFE mixed powder.

A crystalline melting curve of the PTFE mixed powder was obtained by using a differential scanning calorimeter to observe endothermic peaks. Endothermic peaks having a peak temperature of 329° C. and 347° C., respectively, were found. When the height from each base line to each endothermic peak was measured, $P_{329}/P_{347}$ was 4.5/5.5.

One hundred parts by weight of the PTFE powder and 24 parts by weight of the extrusion auxiliary (Isoper E) were mixed and the mixture was paste-extruded by using an extruder (cylinder diameter: 130 mm, mold dice inner diameter: 12 mm) to obtain a round bar. The bar was rolled by using a calender roll adjusted to 70° C. (28 m/minute) to form a film. The rolled film was dried in a hot-air dryer adjusted to 190° C. to prepare a non-sintered PTFE film having a thickness of 500 µm. The film was cut in a length of 50 mm. By using the above-mentioned network analyzer, resonant frequency and Q value were measured according to cavity resonance method, and dielectric constant (∈) and dielectric dissipation factor (tan δ) at 12 GHz were calculated. The results are shown in Table 1.

Each of the above non-sintered PTFE films was immersed in the respective salt baths maintained to 330° C., 335° C., 340° C., 345° C. and 360° C. for 30 seconds, and cooled in the air to prepare heated PTFE films.

Heat of melting of these heated PTFE films was measured by using the differential scanning calorimeter and crystallization conversion was calculated from the values of heat of melting before and after the heating. The results are shown in Table 1.

By using the above-mentioned network analyzer, resonant frequency and Q value were measured according to cavity resonance method, and dielectric constant (∈) and dielectric dissipation factor (tan δ) at 12 GHz were calculated. The results are shown in Table 1.

COMPARATIVE EXAMPLE 2

Paste extrusion was carried out to prepare a non-sintered PTFE film in the same manner as in Example 1 except that the high molecular weight PTFE was solely used. Dielectric constant (∈) and dielectric dissipation factor (tan δ) at 12 GHz were calculated. The results are shown in Table 1.

Subsequently, in the same manner as in Example 2, the films were immersed in the respective salt baths maintained to 330° C., 335° C., 340° C., 345° C. and 360° C. for 30 seconds and cooled in the air to prepare heated PTFE films. Heat of melting was measured by using a differential scanning calorimeter, and crystallization conversion was calculated from the values of heat of melting before and after the heating. The results are shown in Table 1.

By using the above-mentioned network analyzer, resonant frequency and Q value were measured according to cavity resonance method, and dielectric constant (∈) and dielectric dissipation factor (tan δ) at 12 GHz were calculated. The results are shown in Table 1.

EXAMPLE 3

A non-sintered PTFE film was prepared in the same manner as in Example 2 except for using PTFE (average number molecular weight: 3,800,000, maximum endothermic peak temperature: 338° C., average particle size: 0.24 µm, Polyfron F201 available from DAIKIN INDUSTRIES, LTD.) as low molecular weight PTFE. Dielectric constant (∈) and dielectric dissipation factor (tan δ) at 12 GHz were calculated. The results are shown in Table 1.

Subsequently, in the same manner as in Example 2, the films were immersed in the respective salt baths maintained to 330° C., 335° C., 340° C., 345° C. and 360° C. for 30 seconds and cooled in the air to prepare heated PTFE films. Heat of melting was measured by using a differential scanning calorimeter, and crystallization conversion was calculated from the values of heat of melting before and after the heating. The results are shown in Table 1.

By using the above-mentioned network analyzer, resonant frequency and Q value were measured according to cavity resonance method, and dielectric constant (∈) and dielectric dissipation factor (tan δ) at 12 GHz were calculated. The results are shown in Table 1.

TABLE 1

| | Com. Ex. 2 High molecular weight PTFE only | | | Ex. 2 High molecular weight PTFE + Low molecular weight PTFE | | | Ex. 3 High molecular weight PTFE + Low molecular weight PTFE | | |
|---|---|---|---|---|---|---|---|---|---|
| Heating (Sintering) temperature | Crystallization conversion (%) | Dielectric constant | Dielectric dissipation factor (×10$^{-4}$) | Crystallization conversion (%) | Dielectric constant | Dielectric dissipation factor (×10$^{-4}$) | Crystallization conversion (%) | Dielectric constant | Dielectric dissipation factor (×10$^{-4}$) |
| No sintering | 0 | 1.72 | 0.2 | 0 | 1.90 | 1.1 | 0 | 1.88 | 1.4 |
| 330° C. | 4 | 1.85 | 0.3 | 12 | 2.31 | 1.3 | 18 | 2.13 | 1.6 |
| 335° C. | 18 | 2.06 | 0.5 | 36 | 2.29 | 1.6 | 43 | 2.28 | 1.8 |
| 340° C. | 58 | 2.18 | 1.2 | 60 | 2.27 | 2.0 | 60 | 2.28 | 2.0 |
| 345° C. | 99 | 2.12 | 1.8 | 100 | 2.21 | 2.7 | 100 | 2.25 | 2.4 |
| 360° C. | 100 | 2.11 | 1.9 | 100 | 2.21 | 2.7 | 100 | 2.25 | 2.4 |

As Table 1 clearly shows, when the heating (sintering) temperature is adjusted to 335° C. and ranges five degrees below and above the temperature, dielectric constant fluctuates as largely as by 0.33 in the case of using high molecular weight PTFE alone (Comparative Example 2), but the fluctuation of the dielectric constant can be kept as low as 0.03 (Example 2) and 0.15 (Example 3) by mixing low molecular weight PTFE powder.

This means that more flexible control of the heating (sintering) temperature becomes possible.

INDUSTRIAL APPLICABILITY

According to the present invention, a PTFE mixed powder for forming an insulating layer, which has excellent moldability and which makes it easier to control sintering temperature is provided. The insulating layer of high frequency signal transmission device formed by using the PTFE mixed powder of the present invention has low dielectric constant and low dielectric dissipation factor and, in addition, improved end processability.

What is claimed is:

1. A product for high frequency signal transmission obtained by molding a polytetrafluoroethylene mixed powder, wherein said product has evident peak temperatures of 327±5° C. and 340±7° C. in the endothermic curve appearing on the crystalline melting curve which is obtained by using a differential scanning calorimeter;

said polytetrafluoroethylene mixed powder is a polytetrafluoroethylene mixed powder for insulation of a product for high-frequency signal transmission, which is obtained by mixing low molecular weight polytetrafluoroethylene powder and high molecular weight polytetrafluoroethylene powder obtained by emulsion polymerization of tetrafluoroethylene, wherein said low molecular weight polytetrafluoroethylene powder has a number average molecular weight of 1,000,000±500,000 and a maximum peak temperature of 327±5° C. in an endothermic curve appearing on a crystalline melting curve which is obtained by using a differential scanning calorimeter, said high molecular weight polytetrafluoroethylene powder has a number average molecular weight of 4,500,000±1,000,000 and a maximum peak temperature of 340±7° C. in the endothermic curve appearing on a crystalline melting curve which is obtained by a differential scanning calorimeter, and said mixed powder has evident peak temperatures of 327±5° C. and 340±7° C. in the endothermic curve appearing on the crystalline melting curve which is obtained by using a differential scanning calorimeter.

2. The product for high frequency signal transmission of claim 1, wherein the product is a printed wiring board.

3. A high frequency cable having an insulating coating layer, obtained by paste-extruding a polytetrafluoroethylene mixed powder, wherein said insulating coating layer has evident peak temperatures of 327±5° C. and 340±7° C. in the endothermic curve appearing on the crystalline melting curve which is obtained by using a differential scanning calorimeter, said polytetrafluoroethylene mixed powder is a polytetrafluoroethylene mixed powder for insulation of a product for high-frequency signal transmission, which is obtained by mixing low molecular weight polytetrafluoroethylene powder and high molecular weight polytetrafluoroethylene powder obtained by emulsion polymerization of tetrafluoroethylene, wherein said low molecular weight polytetrafluoroethylene powder has a number average molecular weight of 1,000,000±500,000 and a maximum peak temperature of 327±5° C. in an endothermic curve appearing on a crystalline melting curve which is obtained by using a differential scanning calorimeter, said high molecular weight polytetrafluoroethylene powder has a number average molecular weight of 4,500,000±1,000,000 and a maximum peak temperature of 340±7° C. in the endothermic curve appearing on a crystalline melting curve which is obtained by a differential scanning calorimeter, and said mixed powder has evident peak temperatures of 327±5° C. and 340±7° C. in the endothermic curve appearing on the crystalline melting curve which is obtained by using a differential scanning calorimeter.

4. A process for producing the high frequency cable of claim 3, wherein the insulating coating layer obtained by paste-extruding a polytetrafluoroethylene mixed powder is sintered at a temperature of at most the higher maximum peak temperature of the high molecular weight polytetrafluoroethylene, said polytetrafluoroethylene mixed powder is a polytetrafluoroethylene mixed powder for insulation of a product for high-frequency signal transmission, which is obtained by mixing low molecular weight polytetrafluoroethylene powder and high molecular weight polytetrafluoroethylene powder obtained by emulsion polymerization of tetrafluoroethylene, wherein said low molecular weight polytetrafluoroethylene powder has a number average molecular weight of 1,000,000±500,000 and a maximum peak temperature of 327±5° C. in an endothermic curve appearing on a crystalline melting curve which is obtained by using a differential scanning calorimeter, said high molecular weight polytetrafluoroethylene powder has a number average molecular weight of 4,500,000±1,000,000 and a maximum peak temperature of 340±7° C. in the endothermic curve appearing on a crystalline melting curve which is obtained by a differential scanning calorimeter, and said mixed powder has evident peak temperatures of 327±5° C. and 340±7° C. in the endothermic curve appearing on the crystalline melting curve which is obtained by using a differential scanning calorimeter.

5. A product for high frequency signal transmission obtained by molding a polytetrafluoroethylene mixed powder, wherein said product has evident peak temperatures of 327±5° C. and 340±7° C. in the endothermic curve appearing on the crystalline melting curve which is obtained by using a differential scanning calorimeter;

said polytetrafluoroethylene mixed powder is a polytetrafluoroethylene mixed powder for insulation of a product for high-frequency signal transmission, which is obtained by co-coagulation of low molecular weight polytetrafluoroethylene powder and high molecular weight polytetrafluoroethylene powder obtained by emulsion polymerization of tetrafluoroethylene, wherein said low molecular weight polytetrafluoroethylene powder has a number average molecular weight of 1,000,000±500,000 and a maximum peak temperature of 327±5° C. in an endothermic curve appearing on a crystalline melting curve which is obtained by using a differential scanning calorimeter, said high molecular weight polytetrafluoroethylene powder has a number average molecular weight of 4,500,000±1,000,000 and a maximum peak temperature of 340±7° C. in the endothermic curve appearing on a crystalline melting curve which is obtained by a differential scanning calorimeter, and said mixed powder has evident peak temperatures of 327±5° C. and 340±7° C. in the endothermic curve appearing on the crystalline melting curve which is obtained by using a differential scanning calorimeter, and a ratio of a height from a base line to a peak $P_{327}$ to a height from a base line to a peak $P_{340}$ of the polytetrafluoroethylene mixed powder is 1/9 to 9/1, $P_{327}$ representing the peak of the endothermic curve appearing at 327±5° C. and $P_{340}$ representing the peak of the endothermic curve appearing at 340±5° C. on the crystalline melting curve which is obtained by using a differential scanning calorimeter.

6. The product for high frequency signal transmission of claim 5, wherein the product is a printed wiring board.

7. A high frequency cable having an insulating coating layer, obtained by paste-extruding a polytetrafluoroethylene mixed powder, wherein said insulating coating layer has evident peak temperatures of 327±5° C. and 340±7° C. in the endothermic curve appearing on the crystalline melting curve which is obtained by using a differential scanning calorimeter;

said polytetrafluoroethylene mixed powder is a polytetrafluoroethylene mixed powder for insulation of a product for high-frequency signal transmission, which is obtained by co-coagulation of low molecular weight polytetrafluoroethylene powder and high molecular weight polytetrafluoroethylene powder obtained by emulsion polymerization of tetrafluoroethylene, wherein said low molecular weight polytetrafluoroethylene powder has a number average molecular weight of 1,000,000±500,000 and a maximum peak temperature of 327±5° C. in an endothermic curve appearing on a crystalline melting curve which is obtained by a differential scanning calorimeter, said high molecular weight polytetrafluoroethylene powder has a number average molecular weight of 4,500,000±1,000,000 and a maximum peak temperature of 340±7° C. in the endothermic curve appearing on a crystalline melting curve which is obtained by a differential scanning calorimeter, and said mixed powder has evident peak temperatures of 327±5° C. and 340±7° C. in the endothermic curve appearing on the crystalline melting curve which is obtained by using a differential scanning calorimeter, and a ratio of a height from a base line to a peak $P_{327}$ to a height from a base line to a peak $P_{340}$ of the polytetrafluoroethylene mixed powder is 1/9 to 9/1, $P_{327}$ representing the peak of the endothermic curve appearing at 327±5° C. and $P_{340}$ representing the peak of the endothermic curve appearing at 340±5° C. on the crystalline melting curve which is obtained by using a differential scanning calorimeter.

8. A process for producing the high frequency cable of claim 7, wherein the insulating coating layer obtained by paste-extruding the polytetrafluoroethylene mixed powder is sintered at a temperature of at most the higher maximum peak temperature of the high molecular weight polytetrafluoroethylene.

9. A product for high frequency signal transmission obtained by molding a polytetrafluoroethylene mixed powder, wherein said product has evident peak temperatures of 327±5° C. and 340±7° C. in the endothermic curve appearing on the crystalline melting curve which is obtained by using a differential scanning calorimeter;

said polytetrafluoroethylene mixed powder is a polytetrafluoroethylene mixed powder for insulation of a product for high-frequency signal transmission, which is obtained by co-coagulation of low molecular weight polytetrafluoroethylene powder and high molecular weight polytetrafluoroethylene powder obtained by emulsion polymerization of tetrafluoroethylene, wherein said low molecular weight polytetrafluoroethylene powder has a number average molecular weight of 1,000,000±500,000 and a maximum peak temperature of 327±5° C. in an endothermic curve appearing on a crystalline melting curve which is obtained by using a differential scanning calorimeter, said high molecular weight polytetrafluoroethylene powder has a number average molecular weight of 4,500,000±1,000,000 and a maximum peak temperature of 340±7° C. in the endothermic curve appearing on a crystalline melting curve which is obtained by a differential scanning calorimeter, and said mixed powder has evident peak temperatures of 327±5° C. and 340±7° C. in the endothermic curve appearing on the crystalline melting curve which is obtained by using a differential scanning calorimeter.

10. The product for high frequency signal transmission of claim 9, wherein the product is a printed wiring board.

11. A high frequency cable having an insulating coating layer, obtained by paste-extruding a polytetrafluoroethylene mixed powder, wherein said product has evident peak temperatures of 327±5° C. and 340±7° C. in the endothermic curve appearing on the crystalline melting curve which is obtained by using a differential scanning calorimeter;

said polytetrafluoroethylene mixed powder is a polytetrafluoroethylene mixed powder for insulation of a product for high-frequency signal transmission, which is obtained by co-coagulation of low molecular weight polytetrafluoroethylene powder and high molecular weight polytetrafluoroethylene powder obtained by emulsion polymerization of tetrafluoroethylene, wherein said low molecular weight polytetrafluoroethylene powder has a number average molecular weight of 1,000,000±500,000 and a maximum peak temperature of 327±5° C. in an endothermic curve appearing on a crystalline melting curve which is obtained by using a differential scanning calorimeter, said high molecular weight polytetrafluoroethylene powder has a number average molecular weight of 4,500,000±1,000,000 and a maximum peak temperature of 340±7° C. in the endothermic curve appearing on a crystalline melting curve which is obtained by a differential scanning calorimeter, and said mixed powder has evident peak temperatures of 327±5° C. and 340±7° C. in the endothermic curve appearing on the crystalline melting curve which is obtained by using a differential scanning calorimeter.

12. A process for producing the high frequency cable of claim 11, wherein the insulating coating layer obtained by paste-extruding the polytetrafluoroethylene mixed powder is sintered at a temperature of at most the higher maximum peak temperature of the high molecular weight polytetrafluoroethylene.

13. A high frequency cable having an insulating coating layer, obtained by paste-extruding a polytetrafluoroethylene mixed powder, wherein said product has evident peak temperatures of 327±5° C. and 340±7° C. in the endothermic curve appearing on the crystalline melting curve which is obtained by using a differential scanning calorimeter;

said polytetrafluoroethylene mixed powder is a polytetrafluoroethylene mixed powder for insulation of a product for high-frequency signal transmission, which is obtained by co-coagulation of low molecular weight polytetrafluoroethylene powder and high molecular weight polytetrafluoroethylene powder obtained by emulsion polymerization of tetrafluoroethylene, wherein said low molecular weight polytetrafluoroethylene powder has a number average molecular weight of 1,000,000±500,000 and a maximum peak temperature of 327±5° C. in an endothermic curve appearing on a crystalline melting curve which is obtained by using a differential scanning calorimeter, said high molecular weight polytetrafluoroethylene powder has a number average molecular weight of 4,500,000±1,000,000 and a maximum peak temperature of 340±7° C. in the endothermic curve appearing on a crystalline melting curve which is obtained by a differential scanning calorimeter, and said mixed powder has evident peak temperatures of 327±5° C. and 340±7° C. in the endothermic curve appearing on the crystalline melting curve which is obtained by using a differential scanning calorimeter, and a ratio of a height from a base line to a peak $P_{327}$ to a height from a base line to a peak $P_{340}$ of the polytetrafluoroethylene mixed powder is 1/9 to 9/1, $P_{327}$ representing the peak of the endothermic curve appearing at 327±5° C. and $P_{340}$ representing the peak of the endothermic curve appearing at 340±5° C. on the crystalline melting curve which is obtained by using a differential scanning calorimeter.

14. A process for producing the high frequency cable of claim 13, wherein the insulating coating layer obtained by paste-extruding the polytetrafluoroethylene mixed powder is sintered at a temperature of at most the higher maximum peak temperature of the high molecular weight polytetrafluoroethylene.

* * * * *